US009274548B2

(12) United States Patent
Foisy et al.

(10) Patent No.: US 9,274,548 B2
(45) Date of Patent: Mar. 1, 2016

(54) ELECTRONIC APPARATUS COMPRISING BACKPLANE AND METHODS OF ASSEMBLING AND DISASSEMBLING

(71) Applicant: Seagate Technology LLC, Cupertino, CA (US)

(72) Inventors: Paul Foisy, Dunedin, FL (US); Robert I. Walker, Clearwater Beach, FL (US); Timothy P. E. Williams, Wokingham (GB); Edward Janssen, Oviedo, FL (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 129 days.

(21) Appl. No.: 13/782,436

(22) Filed: Mar. 1, 2013

(65) Prior Publication Data

US 2014/0247569 A1 Sep. 4, 2014

(51) Int. Cl.
*G06F 1/16* (2006.01)
*H05K 13/00* (2006.01)
*H05K 7/14* (2006.01)

(52) U.S. Cl.
CPC .............. *G06F 1/16* (2013.01); *H05K 7/1445* (2013.01); *H05K 7/1452* (2013.01); *Y10T 29/49002* (2015.01)

(58) Field of Classification Search
CPC ......................................................... G06F 1/16
USPC ....................................................... 361/759
See application file for complete search history.

(56) References Cited

U.S. PATENT DOCUMENTS

| | | | | |
|---|---|---|---|---|
| 3,733,523 A * | 5/1973 | Reynolds | ............ | H05K 7/1425 211/41.17 |
| 3,963,301 A * | 6/1976 | Stark | ...................... | H01R 23/68 439/680 |
| 4,546,414 A * | 10/1985 | Donges | ................ | H05K 7/1455 361/736 |
| 4,703,394 A * | 10/1987 | Petit | ...................... | H05K 7/1445 361/790 |
| 4,744,006 A * | 5/1988 | Duffield | ................. | G06F 1/184 361/679.32 |
| 4,758,928 A * | 7/1988 | Wierec | ................. | H05K 7/1455 211/41.17 |
| 4,838,798 A * | 6/1989 | Evans | ................ | H01R 12/7082 439/493 |
| 5,040,997 A * | 8/1991 | Garner | ................. | H01R 12/774 439/329 |
| 5,099,394 A * | 3/1992 | Hood | ................... | H05K 7/1461 361/784 |
| 5,121,295 A * | 6/1992 | Lam | ....................... | G06F 1/184 360/137 |

(Continued)

FOREIGN PATENT DOCUMENTS

EP 0737414 A1 4/1996

OTHER PUBLICATIONS

United Kingdom Examination and Search Report of GB 1401941.8 issued Sep. 11, 2014, 6 pages.

*Primary Examiner* — Courtney Smith
*Assistant Examiner* — Rashen E Morrison
(74) *Attorney, Agent, or Firm* — HolzerIPLaw, PC (57) ABSTRACT

The present disclosure relates to an electronic apparatus (100) comprising a backplane (120) and methods of assembling and disassembling such an apparatus. The electronic apparatus (100) comprises a chassis (101) having plural walls and a circuit board (140) fastened to a wall of the chassis, a surface of the circuit board having a plurality of conductive pads (146). A backplane (120) is fastened in a received position in the chassis substantially perpendicular to the circuit board. The backplane has a connector (130) at an edge of the backplane, the connector comprising a plurality of sprung conductive elements (132,134) which extend outwards beyond the edge of the backplane to make electrical contact with respective conductive pads (146) on the circuit board.

14 Claims, 7 Drawing Sheets

(56) References Cited

U.S. PATENT DOCUMENTS

| | | | | |
|---|---|---|---|---|
| 5,251,106 A * | 10/1993 | Hui | H05K 5/0021 | 206/508 |
| 5,313,364 A * | 5/1994 | Omori | G06K 19/07743 | 174/260 |
| 5,338,214 A * | 8/1994 | Steffes | G06F 1/184 | 361/679.32 |
| 5,407,362 A * | 4/1995 | Carstens | H05K 7/1429 | 361/735 |
| 5,424,916 A * | 6/1995 | Martin | H05K 7/20636 | 165/80.4 |
| 5,440,755 A * | 8/1995 | Harwer | H05K 1/14 | 710/105 |
| 5,491,613 A * | 2/1996 | Petitpierre | H05K 9/0062 | 174/355 |
| 5,579,204 A * | 11/1996 | Nelson | G11B 33/128 | 361/679.32 |
| 5,611,057 A * | 3/1997 | Pecone | G06F 1/184 | 361/784 |
| 5,628,637 A * | 5/1997 | Pecone | G06F 1/184 | 361/679.4 |
| 5,738,538 A * | 4/1998 | Bruch | H01R 12/7005 | 439/160 |
| 5,769,668 A * | 6/1998 | Tondreault | H01R 12/721 | 439/326 |
| 5,959,847 A * | 9/1999 | McMillian | H05K 7/186 | 361/752 |
| 5,971,804 A * | 10/1999 | Gallagher | G06F 1/189 | 333/238 |
| 6,026,565 A * | 2/2000 | Giannatto | H05K 7/1424 | 165/104.33 |
| 6,078,504 A * | 6/2000 | Miles | G06F 1/184 | 174/17 CT |
| 6,088,232 A * | 7/2000 | Ho | G06F 1/184 | 361/752 |
| 6,091,609 A * | 7/2000 | Hutson | G06F 1/184 | 307/43 |
| 6,186,798 B1 * | 2/2001 | Follingstad | H01R 13/518 | 361/752 |
| 6,261,104 B1 * | 7/2001 | Leman | G06F 1/184 | 439/61 |
| 6,276,950 B1 * | 8/2001 | Yodogawa | H01R 12/7005 | 439/160 |
| 6,305,848 B1 * | 10/2001 | Gregory | G02B 6/4246 | 385/134 |
| 6,356,959 B1 * | 3/2002 | Thomas | G06F 1/184 | 710/2 |
| 6,411,520 B1 * | 6/2002 | Hauke | H05K 7/1445 | 361/730 |
| 6,460,098 B1 * | 10/2002 | Paul | G06F 13/4086 | 710/301 |
| 6,487,613 B1 * | 11/2002 | Nguyen | G06F 13/4068 | 710/15 |
| 6,587,346 B1 * | 7/2003 | Parker | H01L 23/055 | 165/185 |
| 6,628,513 B1 * | 9/2003 | Gallagher | G06F 1/184 | 361/679.33 |
| 6,789,148 B1 * | 9/2004 | Hinds | H05K 1/142 | 361/679.32 |
| 6,848,927 B2 * | 2/2005 | Shirai | H01R 12/721 | 439/326 |
| 6,862,173 B1 * | 3/2005 | Konshak | G06F 13/409 | 361/679.33 |
| 6,940,730 B1 * | 9/2005 | Berg, Jr. | H04Q 1/10 | 174/383 |
| 6,985,967 B1 * | 1/2006 | Hipp | G06F 1/184 | 361/788 |
| 7,046,470 B2 * | 5/2006 | Yamanashi | G06F 1/20 | 360/69 |
| 7,054,163 B2 * | 5/2006 | Coffey | H04Q 1/14 | 361/730 |
| 7,180,737 B2 * | 2/2007 | Straub, Jr. | H05K 7/20563 | 165/122 |
| 7,210,586 B2 * | 5/2007 | Ice | H05K 7/1404 | 211/26 |
| 7,239,523 B1 * | 7/2007 | Collins | H05K 7/1445 | 361/752 |
| 7,349,226 B2 * | 3/2008 | Ice | H05K 7/1404 | 361/796 |
| 7,372,701 B2 * | 5/2008 | Jacobson | H05K 7/026 | 165/185 |
| 7,535,730 B2 * | 5/2009 | Junkins | H05K 7/1418 | 29/832 |
| 7,633,757 B2 * | 12/2009 | Gustine | H04Q 1/09 | 165/80.3 |
| 7,791,890 B2 * | 9/2010 | Ishida | H05K 7/1492 | 211/26 |
| 7,885,066 B2 * | 2/2011 | Boyden | H05K 7/20563 | 312/236 |
| 7,924,558 B2 * | 4/2011 | Crippen | H01R 12/83 | 345/419 |
| 7,995,346 B2 * | 8/2011 | Biemer | H05K 7/20563 | 312/223.2 |
| 8,014,144 B2 * | 9/2011 | Cheng | G06F 1/187 | 361/679.33 |
| 8,116,078 B2 * | 2/2012 | Xu | G06F 1/181 | 345/502 |
| 8,116,095 B2 * | 2/2012 | Dorenkamp | G02B 6/4452 | 361/729 |
| 8,182,289 B2 * | 5/2012 | Stokoe | H01R 12/721 | 439/607.07 |
| 8,417,071 B2 * | 4/2013 | Hopkins | G02B 6/3897 | 385/135 |
| 8,582,298 B2 * | 11/2013 | Facusse | H05K 7/20809 | 165/104.33 |
| 8,670,228 B2 * | 3/2014 | Hiyama | G06F 1/187 | 361/679.31 |
| 2006/0187634 A1 * | 8/2006 | Tanaka | G06F 1/181 | 361/679.33 |
| 2006/0221559 A1 * | 10/2006 | Campini | H05K 7/1461 | 361/679.36 |
| 2007/0153462 A1 * | 7/2007 | Crippen | H05K 7/1492 | 361/679.02 |
| 2008/0013880 A1 * | 1/2008 | Pitwon | G02B 6/43 | 385/14 |
| 2008/0045044 A1 * | 2/2008 | Yi | H01R 12/52 | 439/65 |
| 2008/0046617 A1 * | 2/2008 | Lee | G06F 13/409 | 710/104 |
| 2008/0199132 A1 * | 8/2008 | Pitwon | G02B 6/4249 | 385/53 |
| 2009/0016037 A1 * | 1/2009 | Chen | G06F 1/185 | 361/810 |
| 2009/0067146 A1 * | 3/2009 | Huels | H05K 1/14 | 361/788 |
| 2010/0225306 A1 * | 9/2010 | Slaton | H05K 1/0295 | 324/149 |
| 2010/0296239 A1 * | 11/2010 | Alyaser | F28D 15/00 | 361/679.53 |
| 2012/0020017 A1 * | 1/2012 | Kehret | G06F 1/183 | 361/679.54 |
| 2012/0176755 A1 * | 7/2012 | Malek | H05K 3/32 | 361/752 |
| 2015/0092788 A1 * | 4/2015 | Kennedy | G06F 1/185 | 370/419 |

* cited by examiner

ELECTRONIC APPARATUS COMPRISING BACKPLANE AND METHODS OF ASSEMBLING AND DISASSEMBLING

The present invention relates to an electronic apparatus comprising a chassis, a backplane and a circuit board, a method of assembling an electrical apparatus, and to a method of disassembling an electrical apparatus.

In preferred embodiments, the present invention relates to storage enclosures for a plurality of media storage devices, "redundant array of inexpensive disks" (RAID) arrays, "storage array network" (SAN) or "network attached storage" (NAS) storage, server enclosures, computing enclosures and the like.

Many electronic apparatus comprise a chassis containing a printed circuit board to which other connection must be made from for example to a front panel or rear panel of the apparatus. Often the circuit board is not positioned close enough to the front panel or rear panel for a direct plug connection. For example the circuit board may be a backplane or midplane to which other modules plug from the front and/or from the back, which means the midplane must be positioned midway or thereabouts between the front and the back of the apparatus. Accordingly, the problem arises of how to assemble the apparatus, and particularly how to assemble the backplane into the apparatus and connect the backplane to some other part of the apparatus which is separated by some distance, and which cannot directly plug into the midplane, e.g. a front panel or rear panel interface circuit board. It is also desirable to be able to quickly and easily remove backplane or the front/rear interface boards independently for servicing.

According to a first aspect of the present invention, there is provided electronic apparatus, comprising:

a chassis having plural walls;

a circuit board fastened to a wall of the chassis, a surface of the circuit board having a plurality of conductive pads;

a backplane fastened in a received position in the chassis substantially perpendicular to the circuit board, wherein the backplane has a connector at an edge of the backplane, the connector comprising a plurality of sprung conductive elements which extend outwards beyond the edge of the backplane to make electrical contact with respective conductive pads on the circuit board.

According to a second aspect of the present invention, there is provided a method of assembling an electronic apparatus, the apparatus comprising a chassis including plural walls, the method comprising:

fastening a circuit board to a wall of the chassis, a surface of the circuit board having a plurality of conductive pads;

advancing a backplane in the chassis, the backplane having a connector at an edge of the backplane, the connector comprising a plurality of sprung conductive elements which extend outwards beyond the edge of the backplane, wherein the backplane is advanced to a received position where the sprung conductive elements make electrical contact with respective conductive pads on the circuit board, wherein the backplane is substantially perpendicular to circuit board; and, fastening the backplane to the chassis in its received position.

This allows for assembly and electrical connection between the two boards whilst eliminating the need for cables to carry signals/power between the backplane and another part of the apparatus away from the backplane, such as a front or rear panel, by using a circuit board to carry the signals/power. At the same time, this allows at least one of the circuit boards to be independently serviceable. This allows for easy insertion and/or extraction of the circuit boards, without the awkward cable assembly in a very tight space required by prior art techniques, saving minutes on assembly times. This also simplifies assembly by reducing the part count, i.e. using one connector instead of two. This can also improve reliability by using a circuit board instead of a cable to carry signals/power.

The preferred embodiments can also be space saving by mounting the circuit board flush against a wall of the chassis, e.g. an external wall, such that it takes up little additional space in the apparatus and placing the connector of the midplane at the edge leaves room in centre of backplane for other connectors and components.

The backplane can be any circuit board that carries signals between various other modules, boards and components in the apparatus. The backplane can be a midplane, i.e. having connectors on both sides for connecting to front and rear modules, etc. The backplane can be passive, just carrying signals between connectors, or active, containing active components.

In embodiments, the circuit board extends past said edge of the backplane with the connector.

In an embodiment, the apparatus comprises a ridge formed with or attached to said wall of the chassis and positioned next to the edge of the circuit board adjacent said connector.

The ridge can be for example an emboss in the wall of the chassis, which may be a convenient way of providing the ridge where the walls are made from sheet metal or the like. Alternatively, separate ridge elements may be fixed to the walls of the chassis. The length of the ridge is preferably at least equal to the length of the connector, i.e. the separation of the two most distant sprung conductive elements. The ridge may span the length of the edge of the circuit board. The ridge may be a continuous ridge or in discrete parts as appropriate for achieving its preferred function during assembly/disassembly of the apparatus of providing a key for the midplane and/or guiding and pre-compressing sprung conductive elements of the midplane connector as they move onto the circuit board to connect with the conductive pads. The ridge is preferably parallel to the edge of the backplane and/or to the edge of the circuit board.

In an embodiment, one side of the ridge abuts the edge of the circuit board and the other side of ridge is ramped.

This helps during assembly of the apparatus in guiding and gradually pre-compressing the sprung conductive elements of the midplane connector as they move onto the circuit board prior to connecting with the conductive pads. Preferably the ridge is flush with the top of the circuit board in this embodiment. Thus, the ridge may be the same height as the thickness of a typical circuit board height, or this thickness plus a small standoff allowance, e.g. the height of the ridge may be between 2 mm and 5 mm. This helps prevent damage to the sprung conductive elements of the connector.

In an embodiment a portion of the edge of the backplane adjacent the connector is recessed, wherein the sprung connector elements extend outwards beyond the recessed edge of the backplane. Preferably at least the leading edge of the backplane is not recessed and defines the maximum overall width across the midplane.

This protects the sprung connector elements as the backplane is advanced into the chassis from above from being knocked or over-compressed and damaged particularly in cases where the insertion direction is perpendicular to the native connector motion of sprung conductive elements. Preferably the sprung conductive elements do not extend further than the non-recessed portion of the edge of the backplane. In embodiments, the circuit board extends through the recess when connected to the backplane.

In an embodiment a portion of the edge of the backplane adjacent the connector is recessed such that the edge is keyed to the ridge, wherein the sprung connector elements extend outwards beyond the recessed edge of the backplane, wherein the recess is keyed to the ridge, such that for assembly of the apparatus the backplane can be:

positioned behind the ridge in an aligned position where the recess is aligned with the ridge; and then advanced towards the circuit board in a direction substantially perpendicular to the backplane so that the ridge passes through the recess and the sprung conductive elements travel onto the surface of the circuit board.

This keying of the edge and the ridge helps protect the backplane from mis-insertion during assembly of the apparatus. The ridge and circuit board extend beyond the wall of the chassis such that the backplane must first be inserted into the chassis behind the ridge and then advanced towards the circuit board in a particular direction, e.g. perpendicular to the backplane, when the sprung conductive elements travel onto the circuit board prior to making connection with the conductive pads. Some types of sprung conductive elements, e.g. sprung fingers, may be designed to connect in only one direction and may be damaged if connected from another direction (e.g. due to lateral force). In the case where the midplane is inserted into the chassis vertically, i.e. in a direction perpendicular to the natural connecting direction of the sprung conductive elements, there is a potential for lateral damage to the sprung conductive elements if the midplane is inserted too far forwards in the chassis such that the sprung conductive elements are forced vertically downwards over the horizontal edge and down over the surface of the circuit board. The present embodiment prevents this because the backplane must be inserted into the chassis behind the ridge (i.e. the opposite side of the ridge to the circuit board) and thus behind the circuit board where the greater width across the chassis can accommodate the overall width of the backplane. Once the key aligns, the backplane can be moved forward in the desired direction for the sprung conductive elements to ride up onto the circuit board, i.e. over a vertical edge, prior to making connection with the conductive pads. In preferred embodiments the ridge has the dual function of providing a key and of gradually guiding and pre-compressing the sprung conductive elements onto the circuit board by providing a ramped surface.

In an embodiment, this movement of the backplane in the perpendicular direction until the sprung conductive elements move onto the surface of the circuit board can achieve alignment of the sprung conductive elements with the conductive pads such that the connection is formed between the backplane and the circuit board. However, in other embodiments, one or more additional movements may be required to align the sprung conductive elements with the conductive pads.

In an embodiment the apparatus is constructed and arranged such that after the edge of the backplane has passed the ridge, the backplane can then be advanced in a direction substantially parallel with the edge of the backplane until the sprung conductive elements align with and make electrical contact with the conductive pads in the received position of the backplane.

This additional movement of the backplane parallel with the edge (i.e. in the plane of the backplane and parallel with the edge so the connector can remain in contact with the surface of the circuit board until the sprung conductive elements align with the conductive pads) can be useful to get backplane deeper into chassis and to mate at bottom.

In an embodiment the apparatus comprises a mating feature for receiving and securing at least some of the leading edge of the backplane as it is advanced to its received position in the chassis.

This secures the bottom of the backplane. Where the backplane is inserted into the chassis from above, access to the bottom of the backplane may be difficult. It may therefore be more convenient for the top of the backplane to be secured by fasteners, whilst the bottom is automatically secured as it is lowered into position.

In an embodiment, the leading edge of the backplane is sloped at the sides so as to guide and position the backplane as it is advanced into its received position in the chassis.

This helps accurately locate the position of the backplane as it is moved to its received position in the chassis.

In an embodiment, there is a portion of circuit board above the topmost conductive pad, wherein the distance between the topmost pad and the top edge of this portion is equal to or greater than the distance that the backplane is advanced in the direction of the edge of the backplane to its received position.

This additional portion of the circuit board above the pads means all the sprung conductive elements all ride up onto the circuit board during the movement perpendicular to board before travelling down to align with the pads.

In an embodiment, the chassis defines an opening which allows during assembly of the apparatus the backplane to be advanced into the chassis through the opening in a direction substantially parallel to said connector edge to reach said position behind the ridge.

This further contributes to allowing the backplane to be assembled in very little space in the chassis. The backplane can be "slotted" into the chassis through an opening in for example the top of the chassis, just behind its final position, in which the backplane moves within its plane and therefore does not need a large space in the chassis to allow this movement. Then, as described above, a small lateral movement of the backplane can then made, i.e. perpendicular to the backplane, towards the circuit board, which allows the ridge to perform its function of keying with the edge of the backplane and/or guiding the sprung conductive elements onto the surface of the circuit board. Optionally, another movement can then be made in the direction of the connector edge to mate the leading edge of the backplane with the chassis.

In an embodiment, the backplane fits between two walls of the chassis with a tolerance which is less than the height of the ridge.

This forces the backplane to be positioned such that the ridge can perform its task, i.e. of being keyed to the backplane and/or guiding the sprung conductive elements on the circuit board when the backplane is being assembled. It may be preferred to make the tolerance quite tight so that the ridge can made less prominent. In preferred examples, the tolerance may be up to 2 mm.

In an embodiment, the circuit board connects to front or rear interface panel containing indicators and/or user controls.

In an embodiment, the apparatus is a storage enclosure containing a plurality of storage devices.

In an embodiment, the walls of the chassis define at least one bay for receiving a module and wherein the backplane has at least one module connector for connecting to the module as it is inserted into the bay.

The module can be a data storage device module, a power supply, an electronics module, another PCB board, etc.

In an embodiment, the backplane is a midplane having connectors on one or both sides for connecting to modules.

The circuit board can be in communication with one or more of these modules via the edge connector, backplane and module connectors.

According to a third aspect of the present invention, there is provided a method of disassembling an electronic apparatus as described above, the method comprising separating the midplane and circuit board by withdrawing the backplane in a direction substantially perpendicular to the midplane and then removing the backplane from the chassis.

According to a fourth aspect of the present invention, there is provided an electronic apparatus, comprising:

a chassis having plural walls;

a circuit board fastened to a wall of the chassis, a surface of the circuit board having a plurality of conductive pads;

a backplane fastened in the chassis substantially perpendicular to the circuit board and having a connector for connecting to the circuit board;

a front or rear panel spaced from the backplane in a direction perpendicular to the backplane, the front or rear panel comprising an interface board in communication with the circuit board, such that the interface board can communicate with the backplane via the circuit board.

Thus, this provides a simple, space effective way of connecting a backplane to a front/rear interface panel without the need for cables.

It will be apparent to a person skilled in the art in the light of the present disclosure that whilst the preferred embodiments may describe orientation and movement of the various circuit boards as being parallel and/or perpendicular to various references, the movement and orientation need not be this exact in order to obtain the benefits of the invention and that some deviation from the precise parallel/perpendicular in encompassed by the claims. Accordingly expressions such as "substantially parallel" and "substantially perpendicular" should be interpreted as meaning approximately or generally parallel or perpendicular. In general, it is preferred that the relevant orientation/movement of the various circuit boards are within ±20° of exactly parallel/perpendicular. In preferred embodiments, closer adherence to exactly parallel/perpendicular, e.g. within ±10°, or even ±5°, or more, may be beneficial in minimising the space needed to assemble the backplane into the chassis.

It will be appreciated that any features expressed herein as being provided "in one example" or as being "preferable" may be provided in combination with any one or more other such features together with any one or more of the aspects of the present invention.

Embodiments of the present invention will now be described by way of example with reference to the accompanying drawings, in which.

Note, as is conventional, references to "widths" and "heights", "above", "below", etc, in relation to the enclosure and/or its bays are given with reference to the orientation of a conventionally mounted enclosure, i.e. one mounted laterally in a 19 inch rack. References to "above" and "side" in relation to the enclosure should be interpreted consistently with this. Nonetheless, these terms should also be construed accordingly to cover a situation where the enclosure is arranged so as to be turned on its side to be vertically arranged, or indeed in any orientation.

Figure 1A:
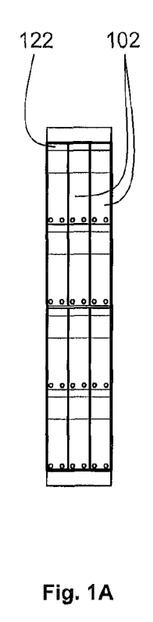
FIG. 1a, 1b, 1c show plan views from the front, from above and from the rear of an example of a storage enclosure according to an embodiment of the present invention.
Figure 1B:
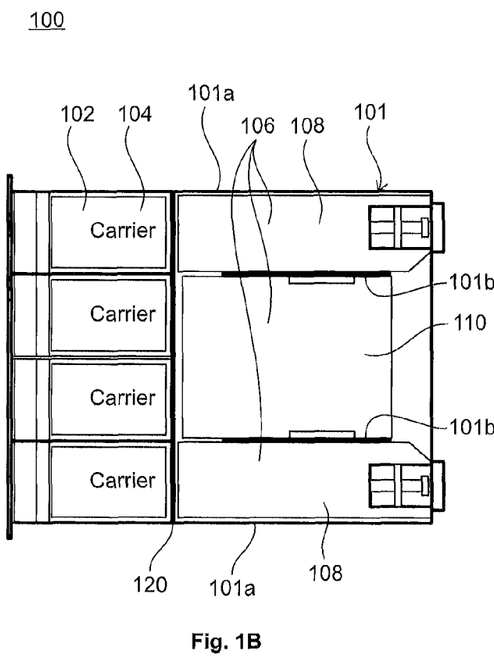
Figure 1C:
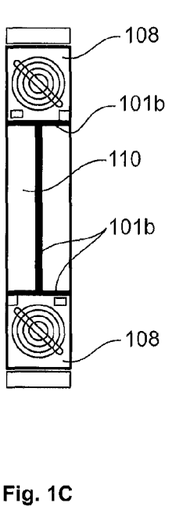

FIG. 1 shows an example of a data storage device enclosure embodying the present invention. The enclosure 100 comprises a chassis or housing 101 comprising walls 101a,b,c defining various bays for modules, etc. The enclosure has storage bays 102 at the front of the enclosure 100 for receiving storage device modules 104 (such as disk drive units or disk drive units mounted in a removable carrier), and bays 106 at the rear of the enclosure for receiving various other modules, such as power supply units and/or cooling modules 108 and various electronics modules 110 (also sometimes referred to as canisters or controllers). These electronics modules 110 typically include one or more controllers for the disk drive assemblies, providing data input/output connections to the enclosure and for organising the disk drive storage, e.g. by providing "just a bunch of disks" (JBOD) functionality or "switched bunch of disks" (SBOD) functionality or "expander-based bunch of disks" (EBOD) functionality based on "SAS expander" technology and/or RAID functionality and/or server functionality etc. The electronics modules 110 may also provide enclosure management services or other functionality. The various modules 104,108,110 plug into a backplane circuit board, more specifically a midplane 120 in this example since modules plug into the midplane from both sides, within the enclosure 100 via connectors as they are inserted into their bays. The enclosure 100 also have an interface panel 122 at the front face (and/or possibly at the rear face) connected to the midplane 120, which may provides various visual indications as to the status of the enclosure and may provide means for a user to control the operation of the enclosure 122. The midplane 120 distributes power and data communications between the various components of the enclosure which connect to it, for example analogue signals, power rails, or low or high-speed data connections, i.e. I2C, SMBUS, SPI, USB, etc., and may also contain active components itself.

Many other layouts and configurations of data storage enclosures 100 are possible and, indeed, available commercially. It will be appreciated that the present invention is not limited to being used with the particular layout of storage enclosure shown by FIG. 1, or indeed with a storage enclosure, but rather is applicable to a broad range of electrical apparatus.

As will be appreciated, fitting more functionality and storage within a given space is an important consideration when designing a storage enclosure 100. Space saving and ease of assembly and maintenance are important considerations.

The chassis 101 is typically made from sheet metal walls fixed together via fasteners, rivets, welds, swage etc. The chassis includes exterior walls 101a and usually interior walls 101b for defining the bays. Because the midplane 120 is positioned generally in the central area of the chassis, i.e. between the front and rear bays, there is therefore a potential difficulty in how to insert and attach the midplane in position. The enclosure 100 is arranged so that various modules 104, 108,110 plug into the midplane 120 in a linear direction as the modules are inserted into their bays. However, making connection between the midplane 120 and the interface panel 122 at the front (or rear) of the enclosure 100 is more challenging because of the separation between the front/rear of the enclosure and the midplane.

In known prior enclosures this connection has achieved by one or more cables or cable harnesses to join the front panel or panels to the central mid-plane 120. However, this arrangement has the disadvantage of being difficult to assemble in the tight space within the chassis 101 and therefore taking more time during assembly. This also makes it more difficult to remove the front interface panel or the mid plane 120 from the enclosure 100 for servicing or replacement. The cable harnesses can be costly, susceptible to damage and unreliable, and may be loose in the assembly during servicing inadvertently damaging components or being misplaced.

Figure 2:
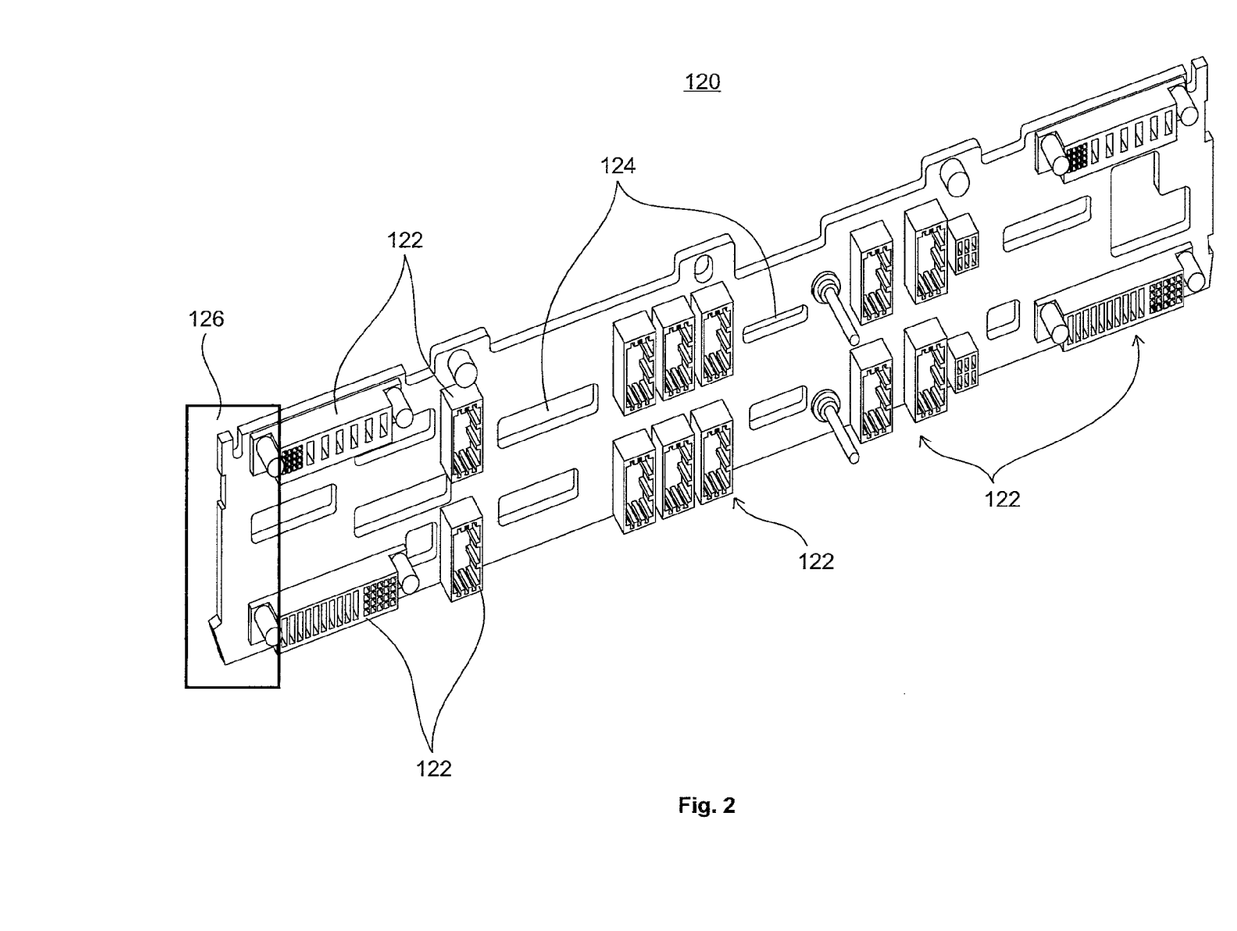
FIG. 2 shows from the rear a midplane for use with the storage enclosure of FIG. 1.
Figure 3:
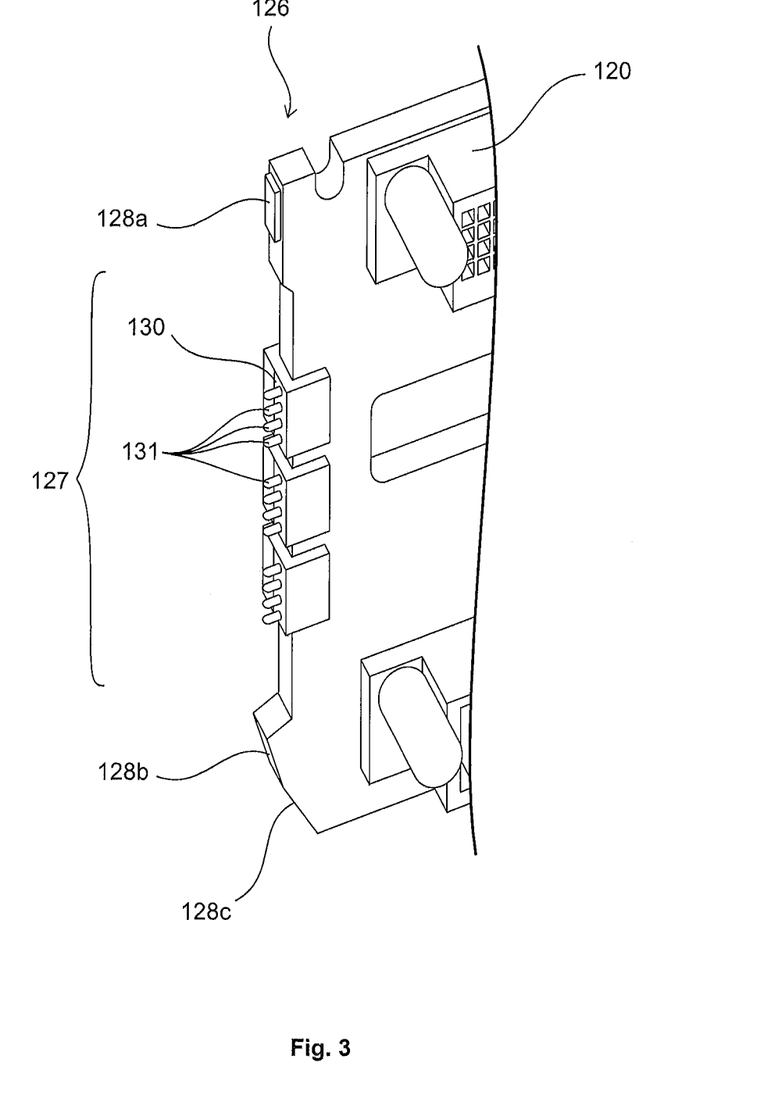
FIG. 3 shows an example of a connector of the midplane.
Figure 4:
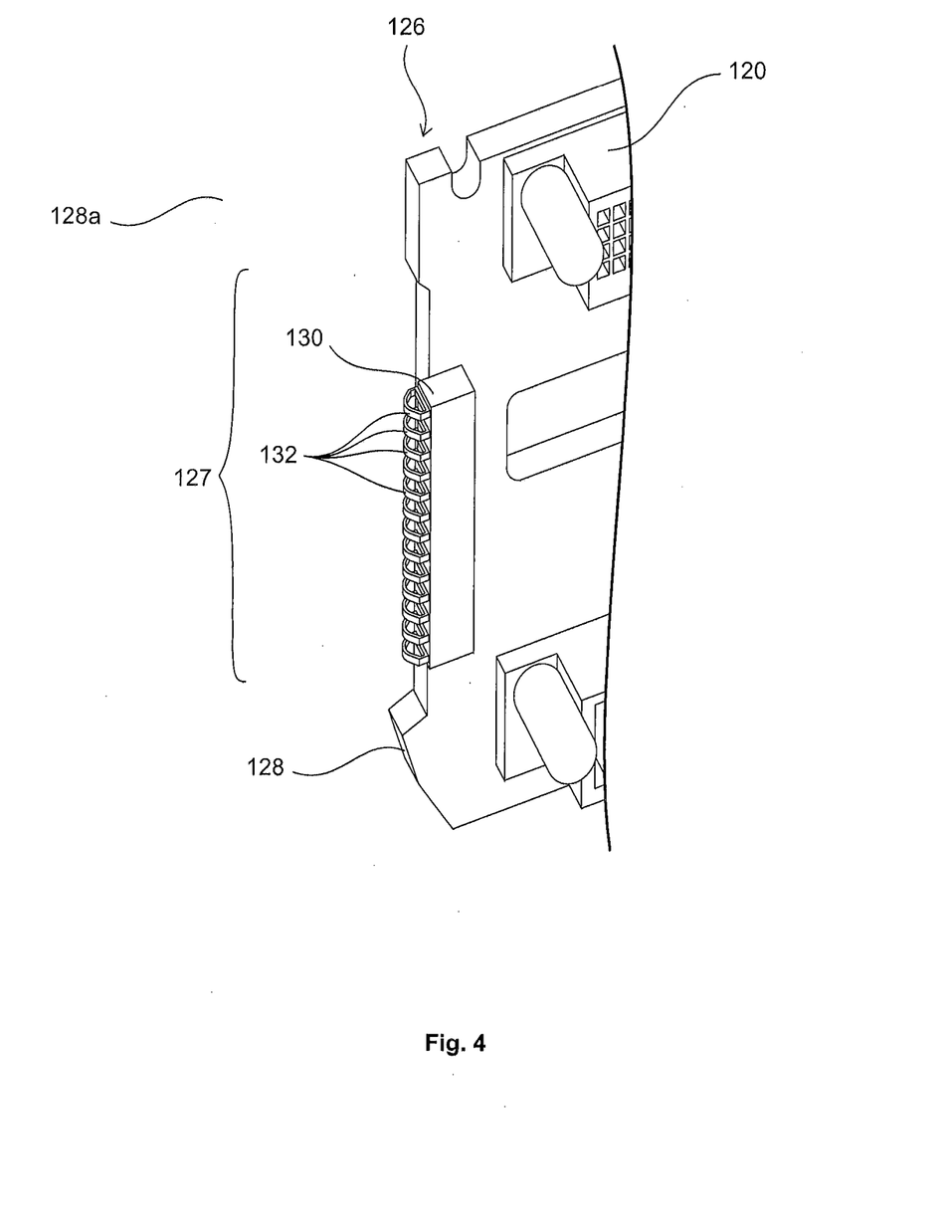
FIG. 4 shows another example of a connector of the midplane.

Turning now to FIG. 2, this shows from the rear an example of a midplane 120. The midplane 120 has various connectors 122 for plugging with modules (108,110) at the rear of the enclosure 100 and vents 124 which allow a cooling airflow to be drawn through the enclosure 100. One or both sides 126 of the midplane 120 have connectors 130, as shown by the detail views of FIGS. 3 and 4, which are in electrical communication with the midplane 120. The side edges 126 of the midplane 120 have a recessed portion 127 around the connector 130. The side edges above 128a and below 128b the recessed portion 127 extend further outwards than the recessed portion. The bottom leading edge forms a "NIB" 128c. A NIB 128c is a tapered protrusion from the primary edge, to act as a guide/key for the midplane 120. The connector 130 comprises sprung conductive elements extending outwards beyond the recessed edge 127 of the midplane 120 for making electrical connection between the midplane and another board. In the example of FIG. 3, the side 126 has a pogo/leaf-spring pin connector 130 comprising a plurality of sprung pins 131 extending outwards beyond the edge of the midplane 120. In the example of FIG. 4, the side has a leaf connector 130 comprising a plurality of leaf springs 132 extending outwards beyond the edge of the midplane 120.

Figure 5:
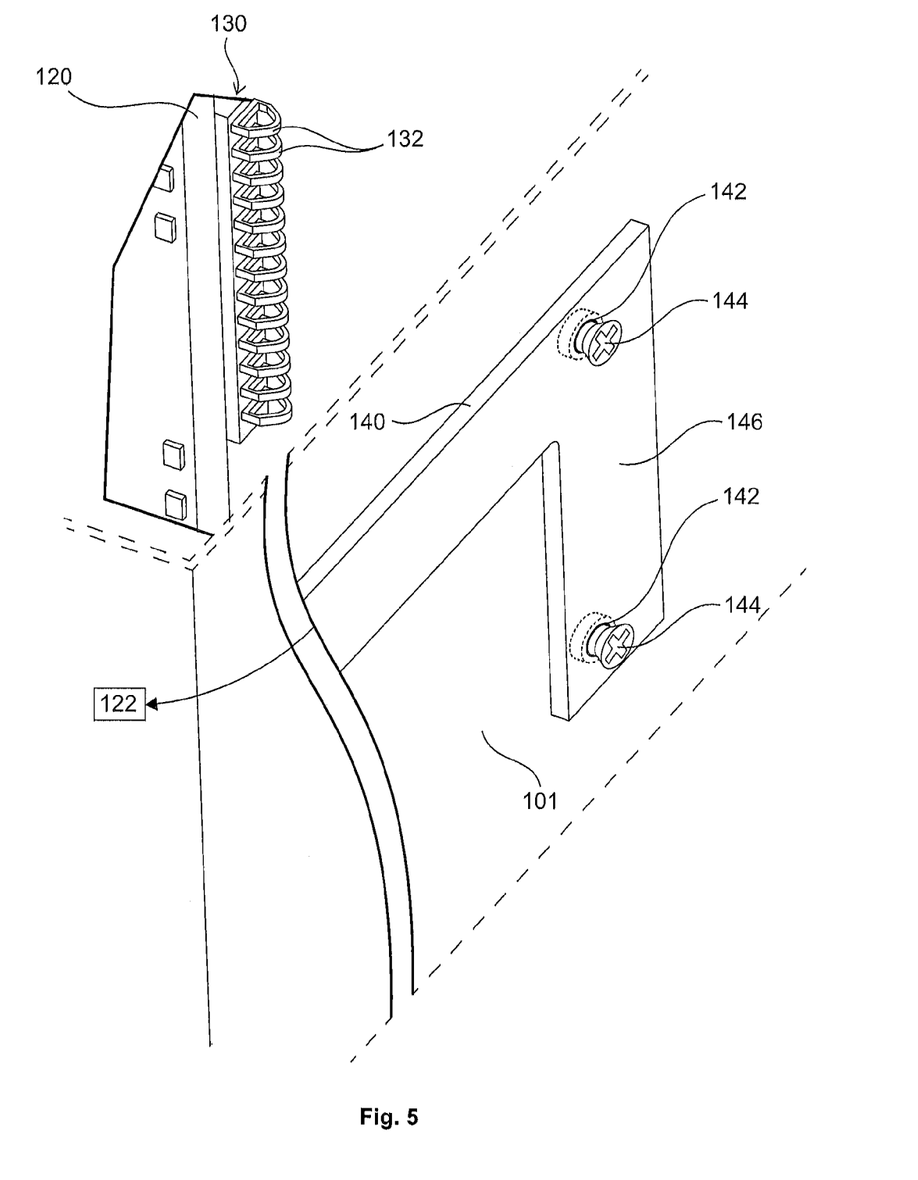
FIG. 5 shows from the front and right hand side a perspective view of a circuit board mounted to the side of the chassis of the enclosure.

A side circuit board 140 is attached to the side of the chassis 101 via fasteners 144 through circuit board holes 142. The circuit board 140 is preferably flush against the side to create a low profile and minimise space. The circuit board 140 is thus substantially perpendicular to the midplane 120 and generally runs from the front of the enclosure to the middle of the enclosure 100. The circuit board 140 is generally L-shape in this example, although as will be appreciated other shapes are possible. The upright end of the circuit board 140 has conductive pads 146 on the interior side arranged in a column for making connection with the sprung conductive elements of the midplane connector 130. The horizontal end of the circuit board 140 extends along the side of the chassis to the front of the enclosure and has conductive traces which connect the conductive pads 146 with the front panel 122 of the enclosure 100. Any suitable means can be used for making electrical connection between the circuit board 140 and the front panel 122 for example using a plug/receptacle connection using for example standard 'pin-header' type connectors.

Figure 6:
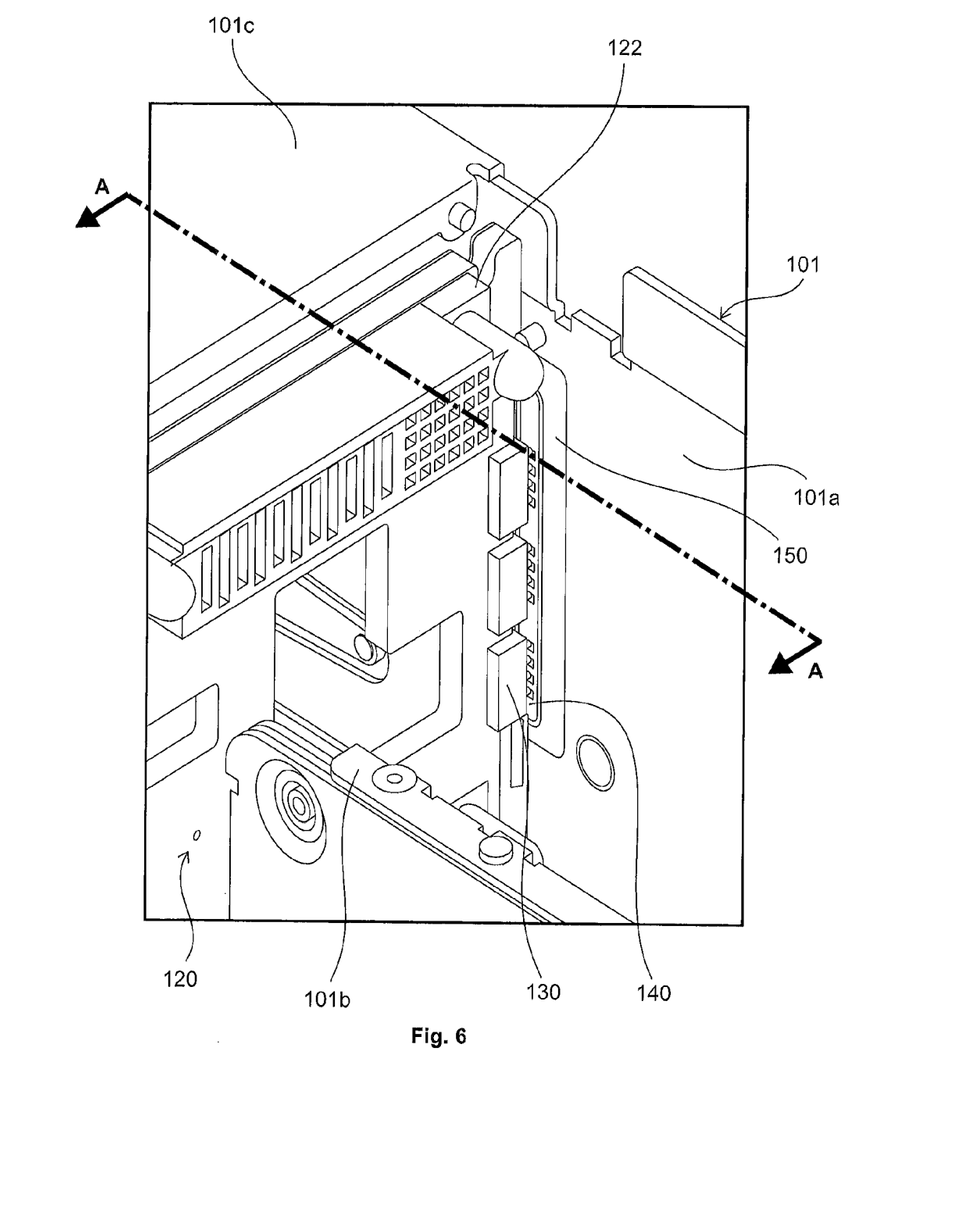
FIG. 6 shows from the rear the midplane connected to the circuit board.

FIG. 6 shows from the rear the midplane 120 and side circuit 140 positioned within the chassis 101. The individual pins 131 of the pogo pin connector 130 are in electrical contact with respective pads 146 on the side circuit 140, thus forming a connection between the midplane 120 and the front panel 122. The top wall 101c of the rear of the enclosure is not shown in this drawing. This top wall 101c is not yet assembled into the chassis 101 to allow access for the midplane 120 to be inserted. As can be seen, there is a space between the end of the interior wall 102b and the final position of the midplane 120 where it is received in the chassis 101. This space allows the midplane to be introduced into the chassis 101 by advancing it downwards into the interior of the chassis 120.

The chassis 101 also has a ridge 150, in this example an emboss, formed in or attached to the side wall and running adjacent to the edge of the side circuit board 140. The forward side of the emboss 150 buts against the side of the side circuit 140. The rearward part of the emboss 150 is sloped from the wall of the chassis 101 to the height of the circuit board 140. Thus the ridge may be the same height as the thickness of a typical circuit board height, or this thickness plus a small standoff allowance, e.g. the height of the ridge may be between 2 mm and 5 mm in preferred examples. In this way, when the midplane 120 is advanced into position within the chassis 101 from the rear of the enclosure, the pogo pins 131 or leaf springs 132 ride up the sloped side of the emboss 150 and pre-compress before passing onto the circuit board 140 which helps prevent possible damage to these elements.

Figure 7:
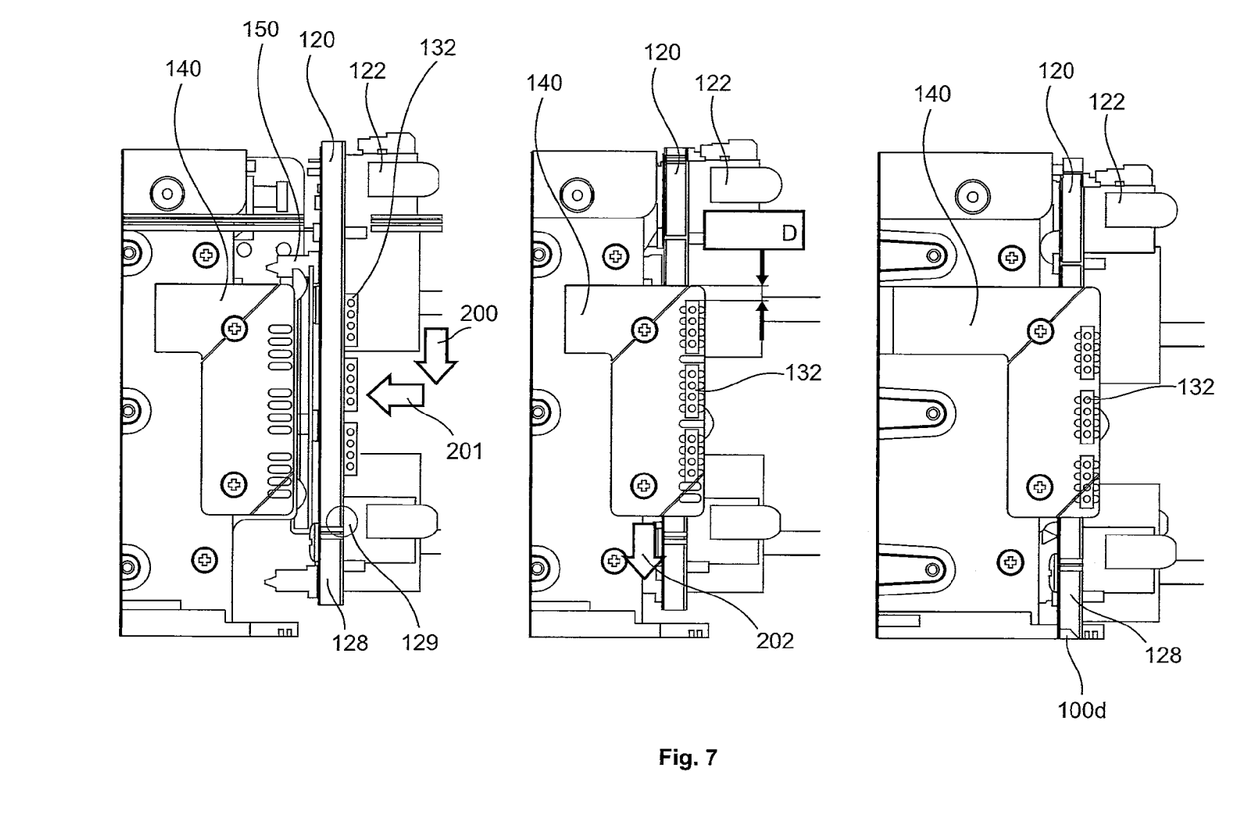
FIGS. 7a to 7c show progressively the midplane being attached to the chassis.

FIGS. 7a to 7c show the sequence of steps by which the midplane 120 is assembled into the enclosure 100. In FIG. 7a, the side of the chassis 101 is shown in transparency. At the beginning of the sequence the side circuit board 140 is already fixed to the side of the chassis 101. The midplane 120 is first advanced downward (arrow 200) into the interior of the chassis 101 just behind its final, received position. The NIB 128 helps guide the midplane into the chassis 101 and protects the exposed pogo pins 131 or leaf springs 132 from striking the side walls of the chassis 101 on the way down. The overall width of the midplane 120 is preferably equal to the width between chassis side walls 101 minus a small tolerance L, e.g. up to 2 mm, on each side. The emboss 150 and the circuit board 140 protrude from the side walls 101 more than L. This means that the midplane 120 must be inserted into the chassis 101 behind the side circuit 140 and emboss 150 and then moved forwards in a separate motion to connect with the side circuit 140. This is important in preventing damage to the connector 130 which might occur if the connection was made from the wrong direction (lateral to normal spring finger direction). For example, the sprung leaf elements 132 are designed to connect in a certain direction, i.e. horizontally as shown in FIG. 5, and may be damaged by vertical connection.

Once the emboss 150 has vertically aligns with the recess 127, the midplane 120 is advanced forwards (arrow 201) in the chassis 101 to the position shown in FIG. 7b. During this movement, the sprung conductive elements 130,131 of the connector 130 ride up the sloped surface of the emboss 150 and onto the circuit board 140, with the end of the circuit board 140 passing the side of the midplane 120 within the recess 127. As shown in FIG. 7b, when top edge 129 of the NIB 128 has just cleared the emboss 150, i.e. the midplane 120 is just far enough down that its can move forwards past the emboss, there is a distance D of preferably at least 1 to 2 mm overlap between the topmost sprung element 131,132 and the top of the side circuit board 140, which ensures that all of the sprung conductive elements 131,132 ride up on the circuit board.

Once the forward movement of the midplane 120 is completed, the midplane 120 is then moved downwards (arrow 202) until the bottom of the midplane 120 mates with a mating feature, such as a recess 101d or slot of the chassis 101, at which point the sprung conductive elements 131,132 are aligned with the pads 146 on the side circuit board 140, as shown in FIG. 7c. The tapered, shaped leading edge of the NIB 128c of the midplane and/or recess 101d help guide the midplane 120 into its final, received position. The midplane 120 is then secured to the chassis 101, e.g. by threaded fasteners or the like. Preferably the midplane 120 can be secured in the chassis 101 without the user of tools, e.g. by following the procedure described above and using thumb screws or some other manual or toolless fastening method to secure the midplane 120.

The midplane 120 can be removed by following the procedure in reverse.

Advantageously, the side circuit board 140 does not have to be removed in order to insert/remove the midplane 120. The midplane 120 removal/insertion can be entirely independent of the side circuit boards 140. The side circuit board 140 can likewise easily be removed without removing the midplane 120 by simply drawing the side circuit board 140 forwards such that the sprung connector elements 131,132 of the midplane connector 130 slide off the side circuit board 140. The side circuit board 140 and midplane connector 130 arrangement can be provided at any edge of the midplane 120, i.e. side, top or bottom, or any combination. The midplane 120 in this example extends between the outer walls 101*a* of the chassis 101 with the side circuit boards being attached to the outer walls 101*a*. However the midplane 120 could equally extend between one or more interior walls 101*b* of the chassis 101, with the side circuit board 140 also being attached in the interior of the chassis 101. In addition, the side circuit board 140 can be used to connect to the rear of the enclosure 100 as well as to the front.

Thus, the preferred embodiments allows for assembly/connection of two circuit boards 120,140, whilst eliminating the need for cables to join front panel to the central midplane 120 while allowing at least one of the circuit boards to be independently serviceable/removable. This allows for easy insertion and/or extraction of the circuit boards 120/140, without the fiddly cable assembly in a very tight space required by prior art techniques, saving minutes on assembly times. This also simplifies assembly by reducing the part count, i.e. using one connector instead of two. The preferred embodiments, uses a PCB 'NIB' as a key to ensure the midplane 120 is inserted forward of the emboss 150 to avoid damage to the leaf-spring contacts 132 which would be incurred on the z-axis insertion movement which is perpendicular to the designed motion of the leaf/pogo-springs. The use of an emboss 150 or other protrusion formed with or attached to the side wall pre-compress the fingers to prevent dragging over the PCB edges.

Embodiments of the present invention have been described with particular reference to the example illustrated. However, it will be appreciated that variations and modifications may be made to the examples described within the scope of the present invention.

The invention claimed is:

1. An electronic apparatus, comprising:
a chassis having plural walls;
a circuit board fastened to a wall of the chassis and being substantially parallel to the wall of the chassis, a surface of the circuit board having a plurality of conductive pads;
a ridge attached to one of the plural walls of the chassis and positioned next to an edge of the circuit board; and
a backplane fastened in a received position in the chassis substantially perpendicular to the circuit board, the backplane having:
a connector at an edge of the backplane, the connector comprising a plurality of sprung conductive elements which extend outwards beyond a recessed portion of the edge of the backplane to make electrical contact with respective conductive pads on the circuit board, the recessed portion keyed to the ridge, such that the backplane can be positioned behind the ridge in an aligned position where the recess is aligned with the ridge, and the ridge passes through the recess and the sprung conductive elements travel onto the surface of the circuit board upon fastening.

2. Apparatus according to claim 1, wherein one side of the ridge abuts the edge of the circuit board and the other side of the ridge is ramped.

3. Apparatus according to claim 1, wherein a portion of the edge of the backplane adjacent the connector is recessed, and wherein the sprung conductive elements extend outwards beyond the recessed edge of the backplane.

4. Apparatus according to claim 1, wherein the apparatus is constructed and arranged such that after the edge of the backplane has passed the ridge, the backplane can advance in a direction substantially parallel with the edge of the backplane until the sprung conductive elements align with and make electrical contact with the conductive pads in a received position of the backplane.

5. Apparatus according to claim 4, further comprising a mating feature for receiving and securing a portion of the leading edge of the backplane as it advances to the received position in the chassis.

6. Apparatus according to claim 5, wherein the leading edge of the backplane is sloped at the sides so as to guide and position the backplane as it advances into the received position in the chassis.

7. Apparatus according to claim 4, wherein there is a portion of the circuit board above the topmost conductive pad, wherein the distance between the topmost pad and the top edge of this portion is equal to or greater than the distance that the backplane advances in the direction of the edge of the backplane to the received position in the chassis.

8. Apparatus according to claim 1, wherein the chassis defines an opening which allows during assembly of the apparatus the backplane to be advanced into the chassis through the opening in a direction substantially parallel to the connector edge to reach the position behind the ridge.

9. Apparatus according to claim 1, wherein the backplane fits between two walls of the chassis with a tolerance which is less than the height of the ridge.

10. Apparatus according to claim 1, wherein the circuit board connects to a front or rear interface panel containing at least one of indicators and user controls.

11. Apparatus according to claim 1, wherein the apparatus is a storage enclosure containing a plurality of storage devices.

12. Apparatus according to claim 1, wherein the walls of the chassis define at least one bay for receiving a module and wherein the backplane has at least one module connector for connecting to the module as it is inserted into the bay.

13. Apparatus according to claim 12, wherein the backplane is a midplane having connectors on at least one side for connecting to modules.

14. An electronic apparatus, comprising:
a chassis having plural walls;
a circuit board fastened to a wall of the chassis and being substantially parallel to the wall of the chassis, a surface of the circuit board having a plurality of conductive pads;
a ride attached to one of the plural walls of the chassis and positioned next to an edge of the circuit board;
a backplane fastened in the chassis substantially perpendicular to the circuit board, the backplane having a connector comprising a plurality of sprung conductive elements which extend outwards beyond the edge of the backplane to make electrical contact with respective conductive pads on the circuit board, the recessed portion keyed to the ridge, such that the backplane can be positioned behind the ridge in an aligned position where the recess is aligned with the ridge, and the ridge passes through the recess and the sprung conductive elements travel onto the surface of the circuit board upon fastening; and a front or rear panel substantially parallel to the backplane and spaced from the backplane in a direction perpendicular to the backplane, the front or rear panel comprising an interface board in communication with the circuit board, such that the interface board can communicate with the backplane via the circuit board.

\* \* \* \* \*